(12) United States Patent
Xu et al.

(10) Patent No.: US 11,043,547 B2
(45) Date of Patent: Jun. 22, 2021

(54) DISPLAY PANEL AND DISPLAY DEVICE HAVING SAME

(71) Applicant: WUHAN CHINA STAR OPTOELECTRONICS SEMICONDUCTOR DISPLAY TECHNOLOGY CO., LTD., Wuhan (CN)

(72) Inventors: Huan Xu, Wuhan (CN); Wu Li, Wuhan (CN); Wei Bi, Wuhan (CN)

(*) Notice: Subject to any disclaimer, the term of this patent is extended or adjusted under 35 U.S.C. 154(b) by 311 days.

(21) Appl. No.: 16/325,406

(22) PCT Filed: Jan. 9, 2019

(86) PCT No.: PCT/CN2019/070930
§ 371 (c)(1),
(2) Date: Feb. 14, 2019

(87) PCT Pub. No.: WO2020/118823
PCT Pub. Date: Jun. 18, 2020

(65) Prior Publication Data
US 2021/0126073 A1 Apr. 29, 2021

(30) Foreign Application Priority Data
Dec. 12, 2018 (CN) .......................... 201811515043.8

(51) Int. Cl.
*H01L 27/32* (2006.01)
*H01L 51/00* (2006.01)

(52) U.S. Cl.
CPC ...... *H01L 27/3276* (2013.01); *H01L 27/3246* (2013.01); *H01L 51/0097* (2013.01); *H01L 2251/5338* (2013.01)

(58) Field of Classification Search
None
See application file for complete search history.

(56) References Cited

U.S. PATENT DOCUMENTS

| 2014/0217397 | A1* | 8/2014 | Kwak | H01L 27/1218 257/43 |
| 2017/0062760 | A1* | 3/2017 | Kim | H01L 27/3276 |
| 2018/0286938 | A1* | 10/2018 | Moon | H01L 51/0097 |

(Continued)

FOREIGN PATENT DOCUMENTS

| CN | 107706220 A | 2/2018 |
| CN | 108288637 A | 7/2018 |
| CN | 208208203 U | 12/2018 |

*Primary Examiner* — J. E. Schoenholtz

(57) ABSTRACT

A display panel and a display device having the display panel are provided. The display panel includes a display region for displaying images; a non-display region disposed outside the display region, and the non-display region includes a bending region; a metal trace extending from the display region to the bending region; and a stress adjustment layer disposed on the metal trace and corresponding to the bending region. The display panel and the display device having the display panel can effectively solve problems such as performance degradation and failure caused by cracking and peeling on the metal trace when the display panel is bent through adding the stress adjustment layer which has a material with the same flexibility as the flexible substrate on an array substrate or different flexibility from the flexible substrate on the array substrate.

8 Claims, 3 Drawing Sheets

(56) References Cited

U.S. PATENT DOCUMENTS

| | | | |
|---|---|---|---|
| 2019/0088685 A1* | 3/2019 | Huang | H01L 51/0097 |
| 2019/0214599 A1* | 7/2019 | Kim | H01L 27/3276 |
| 2020/0098842 A1* | 3/2020 | Jeon | H01L 27/3276 |
| 2020/0411779 A1* | 12/2020 | Tanaka | H01L 51/50 |

* cited by examiner

DISPLAY PANEL AND DISPLAY DEVICE HAVING SAME

BACKGROUND OF INVENTION

Field of Invention

The present invention relates to a field of display devices, and more particularly, to a display panel and a display device having the same.

Description of Prior Art

Organic light emitting diode (OLED) displays have become a mainstream trend in a current display field due to self-emitting, wide viewing angles, a high contrast, and fast response times. Currently, people pursue an excellent display experience, and thus full screens, narrow frames, etc. have become hotspots for development. However, if the OLED displays with full screens and narrow frames are accomplished, a pad bending region of the OLED displays is usually required to be bent. When the pad bending region is bent, a neutral plane of current flexible display devices falls into a flexible substrate. Thus, a metal trace distributed in the pad bending region has a stress-strain problem when a display panel is bent. When the metal trace is bent for several times or the metal trace is subjected to excessive stress, undesirable phenomena, such as cracking and peeling on the metal trace, happen, which affect the transmission of signals and performance of display screens, even lead to the failure of the display screens.

SUMMARY OF INVENTION

The present invention provides a gate driver on array (GOA) circuit to solve a problem that a total width of the clock (CK) signal line is large to require a more layout space and the layout is complicated in the prior art.

The present invention provides a solution to solve the technical problem. A display panel and display panel having the same. A stress adjustment layer is disposed on an array substrate of the display panel, so that when the display panel and the display panel of the display device are bent, a neutral plane is disposed on a layer of meal trace or close to the metal trace as far as possible so as to reduce tensile stress of the metal trace.

In order to solve the technical problem in the prior art, a display panel is provided according to one embodiment of the present invention. The display panel comprises a display region for displaying images; a non-display region disposed outside the display region, wherein the non-display region comprises a bending region; a metal trace extending from the display region to the bend region; and a stress adjustment layer disposed on the metal trace and corresponding to the bending region.

In one embodiment of the present invention, the metal trace is disposed on the flexible substrate, and the stress adjustment layer having a thickness that is less than or equal to a thickness of the flexible substrate.

In one embodiment of the present invention, the stress adjustment layer is at least one material selected from the group consisting of polyimide, polyetherimide, polyphenylene sulfide, and polyarylate, and the flexible substrate is at least one material selected from the group consisting of polyimide, polyetherimide, polyphenylene sulfide, and polyarylate.

In one embodiment of the present invention, a thickness of the stress adjustment layer has a range from 5 to 10 μm.

In one embodiment of the present invention, the display panel further comprises a plurality of layers disposed in the display region and the non-display region, wherein the layers comprise: a barrier layer overlying the flexible substrate; a buffer layer overlying the barrier layer; a first gate insulating layer overlying the buffer layer; a second gate insulating layer overlying the first gate insulating layer; a dielectric layer overlying the second gate insulating layer; the metal trace overlying the dielectric layer; a planar layer overlying the dielectric layer and the metal trace; a pixel defining layer overlying the planar layer; and the stress adjustment layer overlying the pixel defining layer.

In one embodiment of the present invention, a groove is disposed in the bending region and extends from the dielectric layer to the barrier layer, the groove is filled with an organic layer, and the stress adjustment layer is correspondingly disposed on the organic layer.

In one embodiment of the present invention, the groove is a stepped structure, and the groove comprises a first groove body extending from the buffer layer to the barrier layer; a second groove body extending from the dielectric layer to the first gate insulating layer, wherein the first groove body is connected to the second groove body, and a width of the first groove body is less than a width of the second groove body.

In one embodiment of the present invention, in the display region, the display panel further comprises a semiconductor layer disposed on the buffer layer, wherein the first gate insulating layer is disposed on the semiconductor layer; a first gate layer disposed on the first gate insulating layer, wherein the second gate insulating layer is disposed on the first gate layer; a second gate layer disposed on the second gate insulating layer, wherein the dielectric layer is disposed on the second gate layer; a source and a drain connected to the semiconductor layer correspondingly wherein the metal trace, the source, and the drain are disposed on a same layer; an opening disposed on the pixel defining layer at intervals; a light emitting layer disposed in the opening; and an anode disposed on the planar layer, wherein the pixel defining layer overlies the anode, and the opening corresponds to the anode.

In one embodiment of the present invention, when the bending region is bent, a neutral plane is disposed on a layer of the metal trace.

In another embodiment of the present invention, a display device is provided and comprises the display device.

The beneficial effects of the present invention are described as follows. A display panel and a display device having the same are provided. Because a flexible stress adjustment layer, which has the same flexibility as the flexible substrate or a different flexibility from the flexible substrate, is disposed on the pixel defining layer of the array substrate, location of the neutral plane is varied from the flexible substrate to a layer of the metal trace in the bending region when the display region of the display panel is bent. Therefore, a stress distribution structure of the bending region is improved, especially the stress distribution structure of the layer of the metal trace. It effectively solves the problems such as performance degradation and failure caused by cracks and peeling of the metal trace when the display panel is bent.

BRIEF DESCRIPTION OF DRAWINGS

In order to more clearly illustrate embodiments in the present invention, the drawings used in the description of the embodiments will be briefly described below. Obviously, the drawings in the following description are merely some embodiments of the present invention. A person skilled in the art may also obtain other drawings without any creative efforts.

The present invention is further explained below in combination with the drawings and embodiments.

Figure 1:
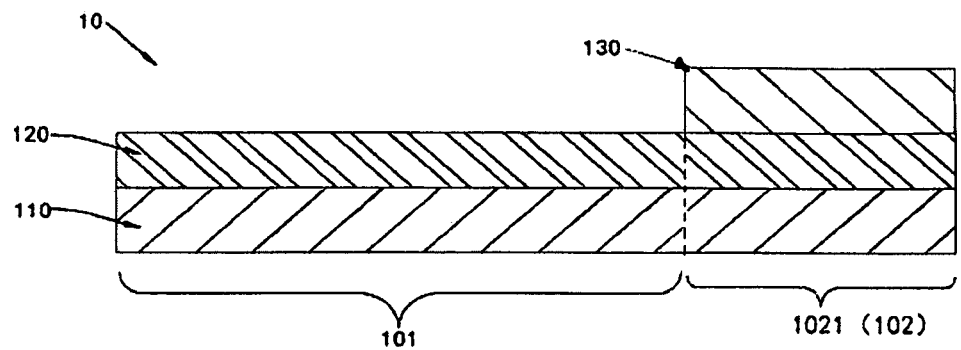
FIG. 1 is a schematic view of a display panel according to one embodiment of the present invention, mainly showing a corresponding position of a stress adjustment layer.

| | |
|---|---|
| display device 1 | color film substrate 20 |
| display panel 10 | touch screen 40 |
| polarizer 30 | non-display region 102 |
| display region 101 | array substrate 120 |
| bending region 1021 | barrier layer 1201 |
| neutral plane 103 | first gate insulating layer 1203 |
| flexible substrate 110 | dielectric layer 1205 |
| stress adjustment layer 130 | pixel defining layer 1207 |
| buffer layer 1202 | first gate layer 1209 |
| second gate insulating layer 1204 | source 1211 |
| planar layer 1206 | opening 1213 |
| semiconductor layer 1208 | metal trace 1215 |
| second gate layer 1210 | organic layer 1217 |
| drain 1212 | first groove body 12161 |
| light emitting layer 1214 | |
| groove 1216 | |
| anode 1218 | |
| second groove body 12162 | |

DETAILED DESCRIPTION OF PREFERRED EMBODIMENTS

The embodiments of the present invention are described in detail below, and the examples of the embodiments are illustrated in the drawings, and the same or similar reference numerals indicate the same or similar elements or elements having the same or similar functions. The embodiments described below with reference to the drawings are intended to be illustrative of the invention and not to be construed as limiting.

The following description of the embodiments is provided by reference to the following drawings. Directional terms mentioned in this application, such as "up," "down," "forward," "backward," "left," "right," "inside," "outside," "side," etc., are merely indicated the direction of the drawings. Therefore, the directional terms are used for illustrating and understanding of the application rather than limiting thereof. In the figures, elements with similar structure are indicated by the same reference numerals.

Referring to FIG. 1, in one embodiment of the present invention, a display panel 10 comprises a display region 101 for displaying images and a non-display region 102 disposed outside the display region 101, and the non-display region 102 comprises a bending region 1021.

The display panel 10 comprises a flexible substrate 110, an array substrate 120, and a stress adjustment layer 130. The array substrate 120 comprises a metal trace 1215 (as shown in FIG. 3), and the array substrate 120 is disposed on the flexible substrate 110, and the stress adjustment layer 130 is disposed on the array substrate 120 and corresponds to the bending region 1021.

Figure 2:
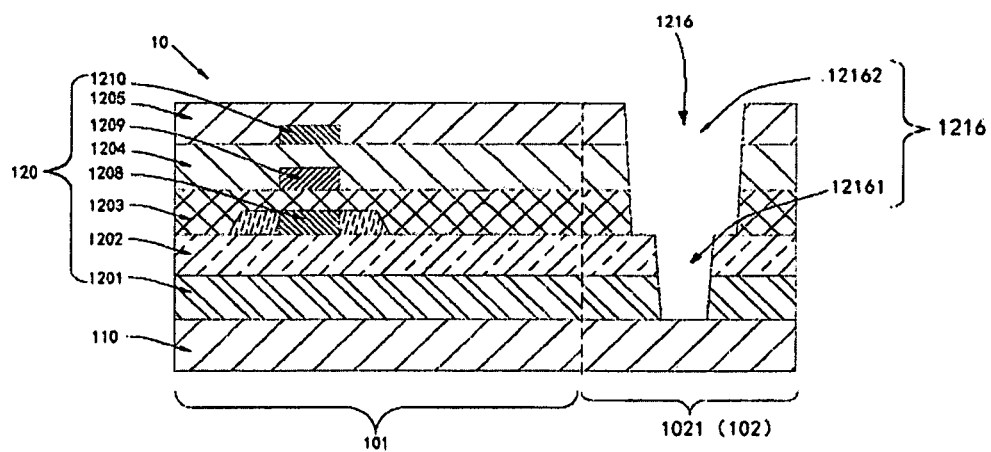
FIG. 2 is a schematic view of a layer structure of the display panel in the fabrication process according to the embodiment of the present invention, mainly showing a groove structure in a bending region of the display panel.
Figure 3:
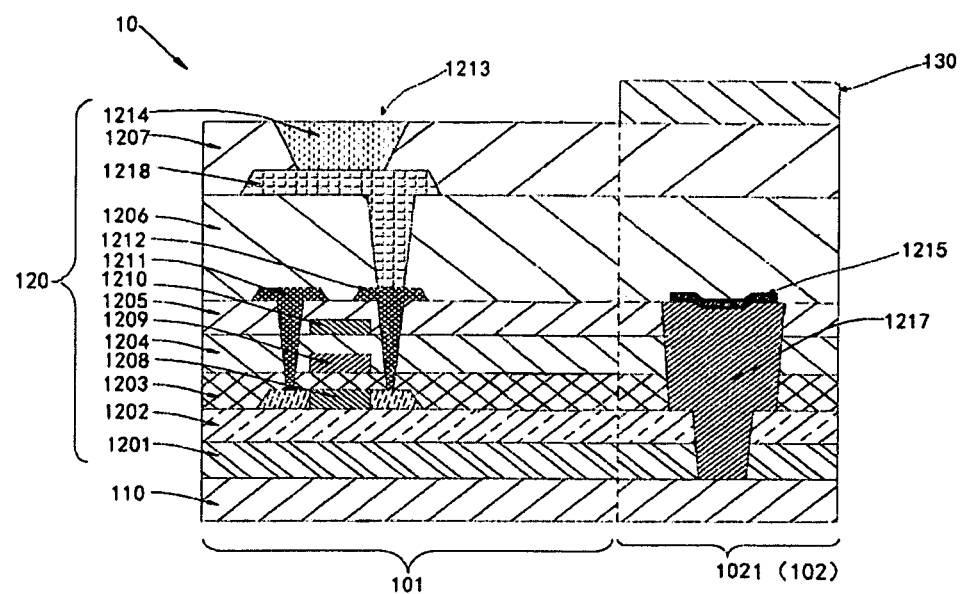
FIG. 3 is a schematic view of a layer structure of an array substrate of the display panel after the display panel is completed according to the embodiment of the present invention.

Referring to FIG. 2 and FIG. 3, in order to more clearly understand the present invention, the array substrate 120 of the embodiment is further described below. In the display region 101 and the non-display region 102, the array substrate 120 comprises a barrier layer 1201, a buffer layer 1202, a first gate insulating layer 1203, a second gate insulating layer 1204, a dielectric layer 1205, a planar layer 1206, and a pixel defining layer 1207. Specifically, the barrier layer 1201 overlies the flexible substrate 110; the buffer layer 1202 overlies the barrier layer 1201; the first gate insulating layer 1203 overlies the buffer layer 1202; the second gate insulating layer 1204 overlies the first gate insulating layer 1203; the dielectric layer 1205 overlies the second gate insulating layer 1204; the planar layer 1206 overlies the dielectric layer 1205; and the pixel defining layer 1207 overlies the planar layer 1206.

Referring FIG. 2 and FIG. 3, in the bending region 1021, the array substrate 120 further comprises a groove 1216 and an organic layer 1217, and the groove 1216 extends from the dielectric layer 1205 to the barrier layer 1201.

During the fabrication process, after the dielectric layer 1205 is formed, the groove 1216 is formed by etching or laser irradiation on a corresponding mask. The organic layer 1217 is then filled in the groove 1216 and the metal trace 1215 is formed on the organic layer 1217.

The groove 1216 is formed as a stepped structure in the array substrate 120, and the groove 1216 is a stepped structure and comprises a first groove body 12161 and a second groove body 12162. The first groove body 12161 extends from the buffer layer 1202 to the barrier layer 1201, and the second groove body 12162 extends from the dielectric layer 1205 to the first gate insulating layer 1203. The first groove body 12161 is connected to the second groove body 12162, and a width of the first groove body 12161 is less than a width of the second groove body 12162. The organic layer 1217 is filled in the groove 1216. In the embodiment, the metal trace 1215, the source and the drain are disposed on the same layer, and the metal trace 1215 overlies the organic layer 1217. The stress adjustment layer 130 overlies the pixel defining layer 1207, and the metal trace 1215 corresponds to the stress adjustment layer 130.

Figure 4:
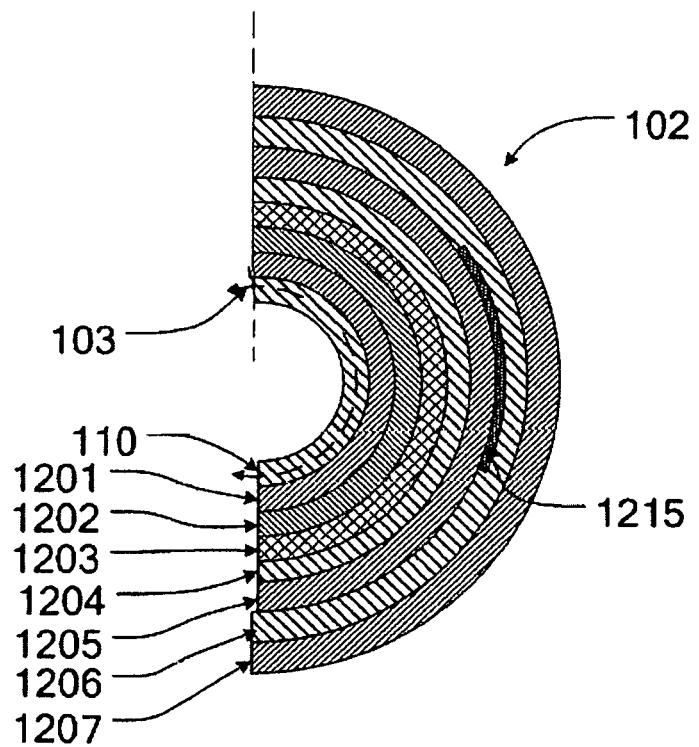
FIG. 4 is a schematic view of a display region of the display panel during a bending process in the prior art, mainly showing a position of a neutral plane.
Figure 5:
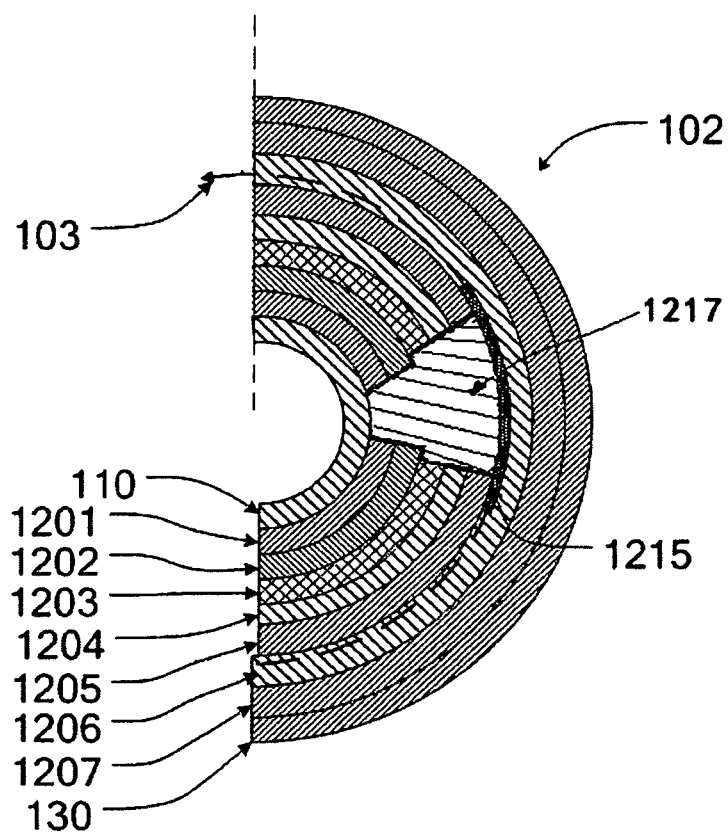
FIG. 5 is a schematic view of the display region of the display panel during the bending process according to the embodiment of the present invention, mainly showing the position of the neutral plane.

In the bending region 1021, since a thickness between the metal trace 1215 and the flexible substrate 110 is D, a thickness between the metal trace 1215 and the stress adjustment layer 130 is E. As shown in FIG. 4, D is greater than E during the actual fabrication process. Therefore, if the stress adjustment layer 130 is not provided, a neutral plane 103 generally falls into the flexible substrate layer 110 as the bending region 1021 is bent. At this time, the metal trace 1215 undergoes an irreversible deformation due to tensile stress and compressive stress and sometimes may even break. As shown in FIG. 5, in the bending region 1021 of the embodiment, the groove 1216 is disposed at a position corresponding the metal trace 1215, and the organic layer 1217 is filled in the groove 1216 so as to adjust the tensile stress of the metal trace 1215 as the metal trace 1215 is bent, so that the tensile stress of the metal trace 1215 matches with the stress adjustment layer 130. Consequently, the neutral plane 103 is further shifted from the flexible substrate 110 to the layer of the metal trace 1215.

At the same time, the required thickness of the stress adjustment layer 130 can be reduced due to the presence of the groove 1216. In the actual fabrication process, in order to make the neutral plane 103 fall on the metal trace 1215 corresponding to the bending region 1021 as far as possible, the thickness of the stress adjustment layer 130 is generally less than or equal to a thickness of the flexible substrate layer 110 according to a thickness of each function layer. The thickness of the stress adjustment layer 130 can be set in the range of 5 to 10 microns.

The flexible substrate is at least one material selected from the group consisting of polyimide, polyetherimide, polyphenylene sulfide, and polyarylate. Therefore, in order to simplify the fabrication process, reduce the difficulty of the process, and conveniently set and adjust the thickness of the stress adjustment layer 130 in the embodiment, the stress adjustment layer 130 is at least one material selected from the group consisting of polyimide, polyetherimide, polyphenylene sulfide, and polyarylate. The material used for the stress adjustment layer 130 can be the same as the material used for the flexible substrate 110 or not.

Referring to FIG. 2 and FIG. 3, in the display region 101, the array substrate 120 further comprises a semiconductor layer 1208, a first gate layer 1209, a second gate layer 1210, a source 1211, a drain 1212, an opening 1213, a light emitting layer 1214, and an anode 1218. The semiconductor layer 1208 is disposed on the buffer layer 1202 and the first gate insulating layer 1203 completely overlies the semiconductor layer 1208. The semiconductor layer 1208 comprises an active layer, and material used for the active layer is one of amorphous silicon, low temperature polycrystalline silicon, and an oxide semiconductor. The first gate layer 1209 is disposed on the first gate insulating layer 1203, and the second gate insulating layer 1204 completely overlies the first gate layer 1209. The second gate layer 1210 is disposed on the second gate insulating layer 1204, and the dielectric layer 1205 overlies the second gate layer 1210. The source 1211 and the drain 1212 are correspondingly connected to the semiconductor layer 1208. The metal trace 1215, the source 1211, and the drain 1212 are disposed on the same layer. The planar layer 1206 overlies the source 1211 and the drain 1212. The opening 1213 is disposed to pass through the whole pixel defining layer 1207, and the light emitting layer 1214 is filled disposed in the opening 1213. The anode 1218 is connected to the drain 1212, and the pixel defining layer 1207 overlies the anode 1218, and the opening 1213 corresponds to the anode 1218.

In the fabrication process, after the buffer layer 1202 is formed, the semiconductor layer 1208 is formed on the buffer layer 1202. Then, the first gate insulating layer 1203 is formed on the buffer layer 1202 and the semiconductor layer 1208. After the first gate insulating layer 1203 is formed, the first gate layer 1209 is formed on the first gate insulating layer 1203. After the first gate layer 1209 is formed, the second gate insulating layer 1204 is formed on the first gate insulating layer 1203 and the first gate layer 1209. After the second gate insulating layer 1204 is formed, the second gate layer 1210 is formed on the second insulating layer 1204. After the second gate layer 1210 is formed, the dielectric layer 1205 is formed on the second gate layer 1210 and the second gate insulating layer 1204. After the dielectric layer 1205 is formed, the source 1211 and a first hole groove of gate are formed by etching or laser irradiation on a corresponding mask. The first hole groove extends from the dielectric layer 1205 to a surface of the semiconductor layer 1208, and the source 1211 and the drain 1212 are formed within the first hole groove, so that the source 1211 and the drain 1212 are connected to the semiconductor layer 1208 correspondingly. After the source 1211 and the drain 1212 are formed, the planar layer 1206 is formed on a surface of the dielectric layer 1205, the source 1211, and the drain 1212. After the planar layer 1206 is formed, a second hole groove is formed on the planar layer 1206 through a corresponding mask. The second hole groove extends from a surface of the planar layer 1206 to the surface of the drain 1212, and then the anode 1218 connected to the drain 1212 is formed within the second hole groove and the planar layer 1206. Next, the pixel defining layer 1207 is formed on the anode 1218 and the planar layer 1206, and thus the subsequent fabrication processes are completed.

Figure 6:
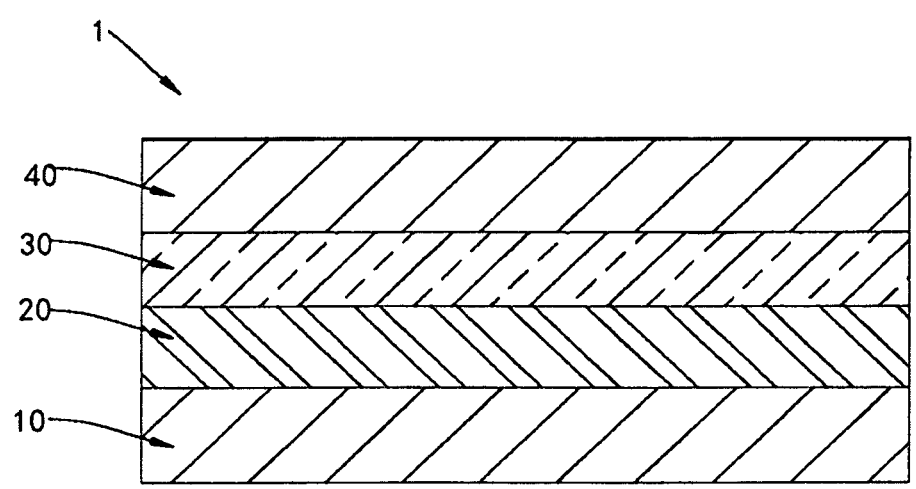
FIG. 6 is a schematic view of the display device according to the embodiment of the present invention.

Referring to FIG. 6, a display device 1 is provided according to another embodiment of the present invention. The display device 1 comprises the display panel 10, a color film substrate 20, a polarizer 30, and a touch screen 40. The focus of the present invention is the display panel 10. Specifically, the stress adjustment layer 130 is disposed on the array substrate 120, and the stress adjustment layer 130 corresponds to the bending region 1021, so that the neutral plane 103 is disposed as far as possible on the metal trace 1215 corresponding the bending region 1021. In general, the display device 1 further comprises function layers of the color film substrate 20 and polarizer 30 according to a thickness of each function layer, and these functional layers are generally far away from the flexible substrate. Therefore, the thickness of the stress adjustment layer 130 should be less than the thickness of the flexible substrate 110 during the actual fabrication for the display device 1. In the embodiment of the present invention, other components of the display device 1, such as the color film substrate 20, the polarizer 30, the touch screen 40, the package frame, and the like are not described again.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:
1. A display panel, comprising:
    a display region for displaying images;
    a non-display region disposed outside the display region, wherein the non-display region comprises a bending region;
    a metal trace extending from the display region to the bending region;
    a stress adjustment layer disposed on the metal trace and corresponding to the bending region;
    a flexible substrate, wherein the metal trace is disposed on the flexible substrate, and the stress adjustment layer having a thickness that is less than or equal to a thickness of the flexible substrate; and
    a plurality of layers disposed in the display region and the non-display region, wherein the layers comprise:
    a barrier layer overlying the flexible substrate;
    a buffer layer overlying the barrier layer;
    a first gate insulating layer overlying the buffer layer;

a second gate insulating layer overlying the first gate insulating layer;

a dielectric layer overlying the second gate insulating layer;

the metal trace overlying the dielectric layer;

a planar layer overlying the dielectric layer and the metal trace;

a pixel defining layer overlying the planar layer; and the stress adjustment layer overlying the pixel defining layer.

2. The display panel according to claim 1, wherein the stress adjustment layer is at least one material selected from the group consisting of polyimide, polyetherimide, polyphenylene sulfide, and polyarylate, and the flexible substrate is at least one material selected from the group consisting of polyimide, polyetherimide, polyphenylene sulfide, and polyarylate.

3. The display panel according to claim 1, wherein a thickness of the stress adjustment layer has a range from 5 to 10 µm.

4. The display panel according to claim 1, wherein a groove is disposed in the bending region and extends from the dielectric layer to the barrier layer, the groove is filled with an organic layer, and the stress adjustment layer is correspondingly disposed on the organic layer.

5. The display panel according to claim 4, wherein the groove is a stepped structure, and the groove comprises:

a first groove body extending from the buffer layer to the barrier layer;

a second groove body extending from the dielectric layer to the first gate insulating layer, wherein the first groove body is connected to the second groove body, and a width of the first groove body is less than a width of the second groove body.

6. The display panel according to claim 1, wherein, in the display region, the display panel further comprises:

a semiconductor layer disposed on the buffer layer, wherein the first gate insulating layer is disposed on the semiconductor layer;

a first gate layer disposed on the first gate insulating layer, wherein the second gate insulating layer is disposed on the first gate layer;

a second gate layer disposed on the second gate insulating layer, wherein the dielectric layer is disposed on the second gate layer;

a source and a drain connected to the semiconductor layer correspondingly wherein the metal trace, the source, and the drain are disposed on a same layer;

an opening disposed on the pixel defining layer at intervals;

a light emitting layer disposed in the opening; and an anode disposed on the planar layer, wherein the pixel defining layer overlies the anode, and the opening corresponds to the anode.

7. The display panel according to claim 1, wherein when the bending region is bent, a neutral plane is disposed on a layer of the metal trace.

8. A display device, comprising the display panel of claim 1.

* * * * *